(12) United States Patent
Joshi

(10) Patent No.: US 7,971,350 B2
(45) Date of Patent: Jul. 5, 2011

(54) METHOD OF PROVIDING A RF SHIELD OF AN ELECTRONIC DEVICE

(75) Inventor: Rajeev Joshi, Cupertino, CA (US)

(73) Assignee: Flextronics AP, LLC, Broomfield, CO (US)

(*) Notice: Subject to any disclaimer, the term of this patent is extended or adjusted under 35 U.S.C. 154(b) by 169 days.

(21) Appl. No.: 12/221,256

(22) Filed: Jul. 31, 2008

(65) Prior Publication Data
US 2009/0032300 A1  Feb. 5, 2009

Related U.S. Application Data

(60) Provisional application No. 60/963,115, filed on Aug. 1, 2007.

(51) Int. Cl.
*H05K 3/30* (2006.01)
(52) U.S. Cl. ............... 29/841; 29/832; 29/840; 257/734
(58) Field of Classification Search ............ 29/825, 29/830, 832, 840, 852, 841; 257/734
See application file for complete search history.

(56) References Cited

U.S. PATENT DOCUMENTS

| 4,703,133 A | 10/1987 | Miller | 174/35 |
| 7,187,060 B2* | 3/2007 | Usui | 257/659 |
| 2004/0178500 A1* | 9/2004 | Usui | 257/734 |
| 2007/0163802 A1 | 7/2007 | Monthei | 174/350 |

* cited by examiner

*Primary Examiner* — C. J Arbes
(74) *Attorney, Agent, or Firm* — Haverstock & Owens LLP

(57) ABSTRACT

A shielding assembly is configured to provide electromagnetic shielding and environmental protection to one or more electronic components coupled to a substrate. The shielding assembly includes a non-conductive mold compound layer, such as a dielectric epoxy. The mold compound layer is applied to a top surface of the substrate, thereby covering the electronic components and providing protection against environmentally induced conditions such as corrosion, humidity, and mechanical stress. The shielding assembly also includes a conductive layer applied to a top surface of the mold compound layer. The conductive layer is coupled to a ground plane in the substrate, thereby enabling the electromagnetic shielding function. The conductive layer is coupled to the ground plane via one or more metallized contacts that are coupled to the substrate and extend through the mold compound layer.

29 Claims, 4 Drawing Sheets

METHOD OF PROVIDING A RF SHIELD OF AN ELECTRONIC DEVICE

RELATED APPLICATIONS

This application claims priority of U.S. provisional application, Ser. No. 60/963,115, filed Aug. 1, 2007, and entitled "Method to Create a RF Shield on an Electronic Component", by these same inventor. This application incorporates U.S. provisional application, Ser. No. 60/963,115 in its entirety by reference.

FIELD OF THE INVENTION

The present invention relates to electromagnetic shielding. More particularly, the present invention relates to providing RF shielding on an electronic component.

BACKGROUND

An electronic device is susceptible to external electromagnetic interference. Electromagnetic shielding limits electromagnetic fields from reaching the electronic device, or specific electronic components within the electronic device, and is typically accomplished using a barrier made of conductive material. Electromagnetic shielding used to block radio frequency electromagnetic radiation is also known as RF shielding. Common materials used for electromagnetic shielding include sheet metal, metal mesh, and metal foam. The barrier is either an unbroken conductive surface or approximates an unbroken conductive surface. Holes in the conductive material must be smaller than the wavelength of the electromagnetic radiation that is being kept out, or the barrier will not effectively approximate an unbroken conducting surface. Another commonly used shielding method, especially with electronic goods housed in plastic enclosures, is to coat the inside of the enclosure with a metallic ink or similar material. The metallic ink includes a carrier material loaded with a suitable metal, such as copper or nickel, in the form of very small particulates. The metallic ink is sprayed on to the enclosure and, once dry, produces a continuous conductive layer of metal, which is then electrically coupled to a chassis ground of the equipment, thereby providing effective shielding.

In some applications, RF shielding is currently provided using a metal can shield over a high density substrate that is populated with electronic components. An RF shield is provided once the metal can is connected and conductively coupled to a ground plane included on the substrate. The metal can is connected to the ground plane via a guard ring on the substrate. The guard ring is positioned on a top surface of the substrate and coupled to the ground plane. The metal can is connected to the guard ring either mechanically or using solder. The metal can provides a radio frequency shielding capability, but increases the height of the component and typically increases the cost. With electronics moving toward miniaturization, increased size is not desirable. Also, metal cans become a dedicated piece part for a particular form factor module. The particular form factor must be accounted for in the manufacturing process. In applications that require environmental protection of the electronic components, such as protection against corrosion, humidity, and mechanical stress, the metal can is under-filled to cover the electronic components. The under-fill material is relatively expensive and the process of adding the under-fill requires additional steps in the manufacturing process.

SUMMARY OF THE INVENTION

A shielding assembly is configured to provide electromagnetic shielding and environmental protection to one or more electronic components coupled to a substrate. The shielding assembly includes a non-conductive mold compound layer, such as a dielectric epoxy. The mold compound layer is applied to a top surface of the substrate, thereby covering the electronic components and providing protection against environmentally induced conditions such as corrosion, humidity, and mechanical stress. The shielding assembly also includes a conductive layer applied to a top surface of the mold compound layer. The conductive layer is coupled to a ground plane in the substrate, thereby enabling the electromagnetic shielding function. The conductive layer is coupled to the ground plane via one or more metallized contacts that are coupled to the substrate and extend through the mold compound layer.

In one aspect, a method of providing electromagnetic shielding of one or more electronic devices is disclosed. The method includes providing a substrate including a ground plane and one or more electronic devices coupled to a top surface of the substrate, adding one or more metallized contact base areas to the top surface of the substrate, wherein each of the metallized contact base areas is conductively coupled to the ground plane, and adding a metallized contact extension to each metallized contact base area, thereby forming one or more metallized contacts. The method also includes applying a non-conductive mold compound layer to the top surface of the substrate, wherein the mold compound layer covers the one or more electronic devices and a top portion of each metallized contact extends from the mold compound layer, and applying a conductive layer to a top surface of the mold compound layer, wherein the conductive layer is conductively coupled to the top portion of each metallized contact layer, thereby coupling conductively coupling the conductive layer to the ground plane. In some embodiments, each metallized contact has a height that is greater than a height of each of the one or more electronic devices coupled to the substrate, and a thickness of the mold compound layer is less than the height of each of the one or more metallized contacts. In this case, a difference between the thickness of the mold compound layer and the height of each electronic device is equal to or greater than a predetermined minimum value. In some embodiments, wherein adding the metallized contact base areas comprises depositing a conductive material layer on the top surface of the substrate and etching the conductive material layer. In other embodiments, the metallized contact extension is a solder ball. In some embodiments, applying the mold compound layer includes using a transfer molding process. In some embodiments, applying the conductive layer comprises using a screen printing process. In this case, the conductive layer can be a conductive epoxy. In other embodiments, applying the conductive layer comprises sputtering a conducive material onto the top surface of the mold compound layer. The conductive layer coupled to the ground plane shields the one or more electronic devices from electromagnetic interference. In some applications, the conductive layer coupled to the ground plane provides radio frequency shielding of the one or more electronic devices. The mold compound layer can protect the one or more electronic devices from environmental conditions including corrosion, humidity, and mechanical stress. In some embodiments, the mold compound layer is a dielectric epoxy. In some embodiments, the mold compound layer conforms around the metallized contacts when applied to the top surface of the substrate. In some embodiments, the mold compound layer forms an over-molded package over the one or more electronic devices.

In another aspect, an apparatus for providing electromagnetic shielding of one or more electronic devices is disclosed.

The apparatus includes a substrate, one or more metallized contact base areas, a metallized contact extension coupled to each metallized contact base area, a non-conductive mold compound layer, and a conductive layer. The substrate includes a ground plane and one or more electronic devices coupled to a top surface of the substrate. The one or more metallized contact base areas are coupled to the top surface of the substrate, wherein each of the metallized contact base areas is conductively coupled to the ground plane. Each metallized contact extension coupled to each metallized contact base area forms a metallized contact, wherein each metallized contact has a height that is greater than a height of each of the one or more electronic devices coupled to the substrate. The non-conductive mold compound layer is coupled to the top surface of the substrate, wherein the mold compound layer is configured to cover the one or more electronic devices, further wherein a thickness of the mold compound layer is less than the height of the one or more metallized contacts such that a top portion of each metallized contact extends from the mold compound layer. The conductive layer is coupled to a top surface of the mold compound layer, wherein the conductive layer is conductively coupled to the top portion of each metallized contact layer such that a conductive path is formed from the conductive layer to the ground plane. The metallized contact extension can be a solder ball. The conductive layer can be a conductive epoxy. The mold compound layer can be a dielectric epoxy. The conductive layer coupled to the ground plane is configured to shield the one or more electronic devices from electromagnetic interference. In some applications, the conductive layer coupled to the ground plane is configured to provide radio frequency shielding of the one or more electronic devices. In some embodiments, a difference between the thickness of the mold compound layer and the height of each electronic device is equal to or greater than a predetermined minimum value. In some embodiments, the mold compound layer is configured to protect the one or more electronic devices from environmental conditions including corrosion, humidity, and mechanical stress. In some embodiments, the mold compound layer conforms around the metallized contacts. In some embodiments, the mold compound layer forms an over-molded package over the one or more electronic devices.

Other features and advantages of the present invention will become apparent after reviewing the detailed description of the embodiments set forth below.

BRIEF DESCRIPTION OF THE DRAWINGS

The accompanying drawings, which are incorporated in and form a part of this specification, illustrate embodiments of the invention and, together with the description, serve to explain the principles of the invention, but not limit the invention to the disclosed examples.

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Figure 1:
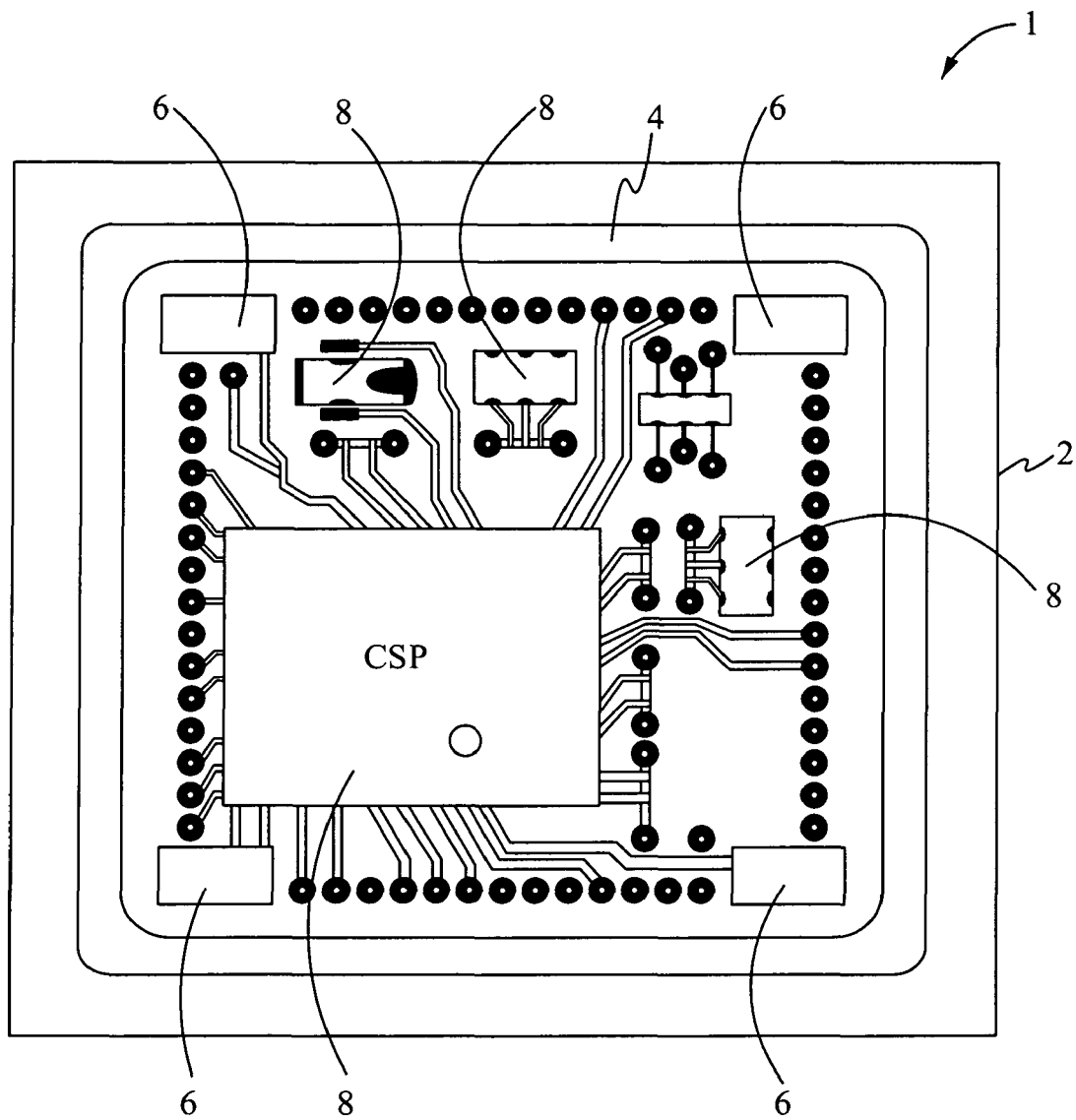
FIG. 1 illustrates a top down view of an exemplary electronic device to which the electromagnetic shielding of the present invention is applied.

Reference will now be made in detail to the embodiments of the electromagnetic shielding method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art that the present invention may be practiced without these specific details. In other instances, well-known methods and procedures, components and processes haven not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of the present invention are directed to a method of and apparatus for providing electromagnetic shielding to one or more electronic components coupled to a substrate. In an exemplary application, the one or more electronics components are integrated circuits coupled to a printed circuit board. One or more metallized contacts are added to the substrate. In some embodiments, each metallized contact is made of two components, a metallized contact base and a metallized contact extension. The metallized contact base is a relatively small, thin piece of conductive material, such as a metal plate or swatch, that is coupled to a top surface of the substrate. The substrate includes a ground plane and the metallized contact base is conductively coupled to the ground plane using any conventional method including a conductive trace or wire. The metallized contact extension is conductively coupled on top of the metallized contact base. In some embodiments, the metallized contact extension is a solder ball. In general, the metallized contact extension is a block of conductive material. The metallized contact base and the metallized contact extension form the metallized contact, which extends a predetermined height above the top surface of the substrate. The predetermined height is greater than a height of each of the integrated circuits coupled to the substrate. In other embodiments, the metallized contact is a single component that is coupled to a conductive element or pathway on the substrate, where the conductive element or pathway is coupled to the substrate ground plane.

A non-conductive mold compound material is applied to the top surface of the substrate, thereby forming on over-molded mold compound layer that covers the electronic components and conforms around the metallized contacts. In some embodiments, the mold compound material is applied in a liquid-phase to the top surface of the substrate. In other embodiments, the mold compound material is applied in a solid-phase to the top surface of the substrate, where a proper heat and pressure are then applied to liquefy the mold compound material. In either case, the liquified mold compound material is then allowed to dry, thereby forming the over-molded compound layer. A thickness of the mold compound layer and the height of the metallized contact are configured such that a top portion, or top surface, of the metallized contact extends above the mold compound layer. A layer of conductive material is then applied to a top surface of the mold compound layer. The conductive layer is in contact with the exposed portion of the metallized contact, thereby providing a conductive pathway from the conductive layer to the ground plane within the substrate. The conductive layer coupled to the ground plane and the mold compound layer form a shielding assembly, where the conductive layer coupled to the ground plane provides an electromagnetic shield and the mold compound layer provides environmental protection for the electronic components coupled to the substrate.

In an exemplary application, the shielding assembly is applied to a WiFi module to provide RF shielding. It is understood that the shielding assembly can be applied to other types of electronic modules to shield from other frequencies than radio frequencies.

FIG. 1 illustrates a top down view of an exemplary electronic device 1 to which the electromagnetic shielding of the present invention is applied. A substrate 2, such as a printed circuit board, includes a ground plane, such as a ground plane 4, and a plurality of electronic components 8 coupled to the substrate 2. Metallized contacts 6 are each mechanically coupled to the substrate 2 using any conventional joining means and conductively coupled to the ground plane 4 using a conductive pathway 14 (FIG. 3), such as a trace, wire, or other conventional conducting means. Although four metallized contacts 6 are shown in FIG. 1, it is understood that more or less than four metallized contacts can be coupled to the substrate 2. Also, the position of each of the metallized contacts 6 shown in FIG. 1 is for exemplary purposes only. The position of each metallized contact can be different than the positions shown in FIG. 1. In general, the positions of the metallized contacts are a design consideration and can be placed anywhere on the top surface of the substrate 2 that enables conductive coupling with the substrate ground plane.

Figure 2:
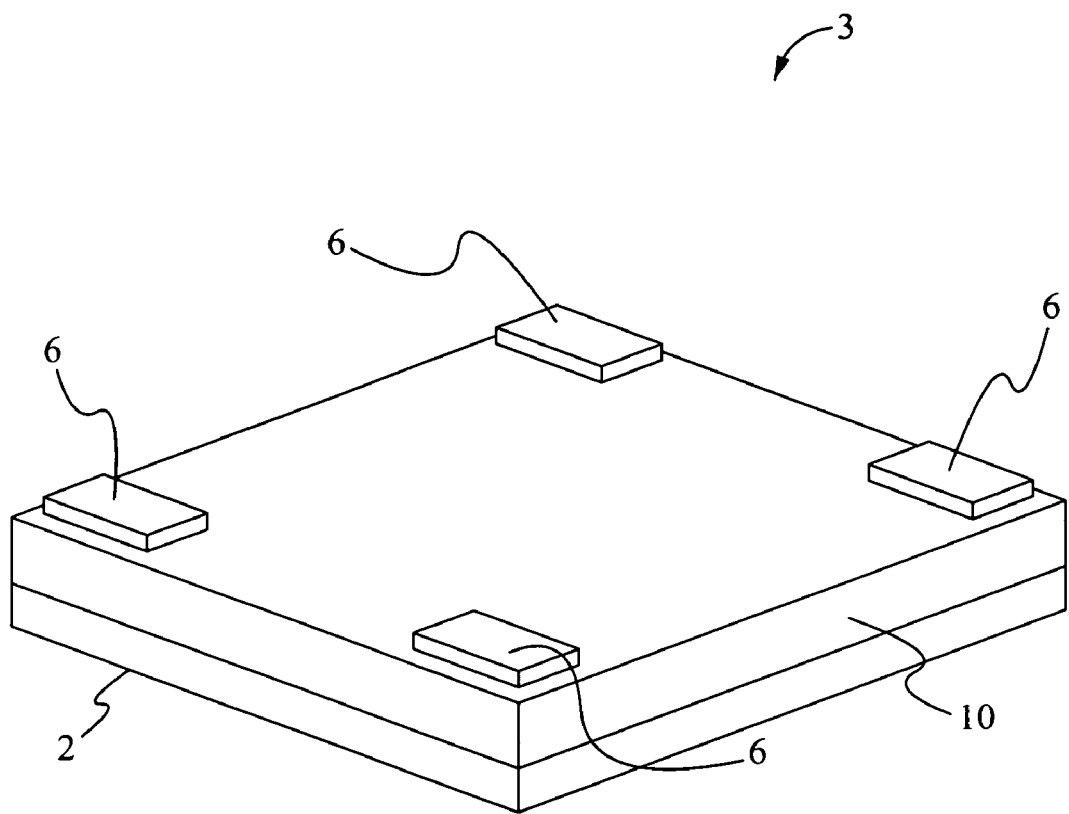
FIG. 2 illustrates an isometric view of a portion of a shielding assembly.

FIG. 2 illustrates an isometric view of a portion of a shielding assembly 3. The shielding assembly 3 includes a mold cap 10 coupled to the metallized contacts 6. The mold cap 10 is coupled to the substrate 2, which includes the electronic components 8 (FIG. 1). The mold cap 10 is formed of a mold compound layer that is over-molded on the substrate 2, thereby covering the electronic components 8 and forming around the metallized contacts 6. FIG. 2 illustrates the three-dimensional aspect of the metallized contacts 6, which extend a height $H_{MC}$ (FIG. 4) above a top surface of the substrate 2, and at least a top surface of the metallized contacts 6 extend above a top surface of the mold cap 10. A conductive layer (not shown) is added to a top surface of the mold cap 10 and coupled to the ground plane 4 (FIG. 1) within the substrate 2 via the metallized contacts 6.

Figure 3:
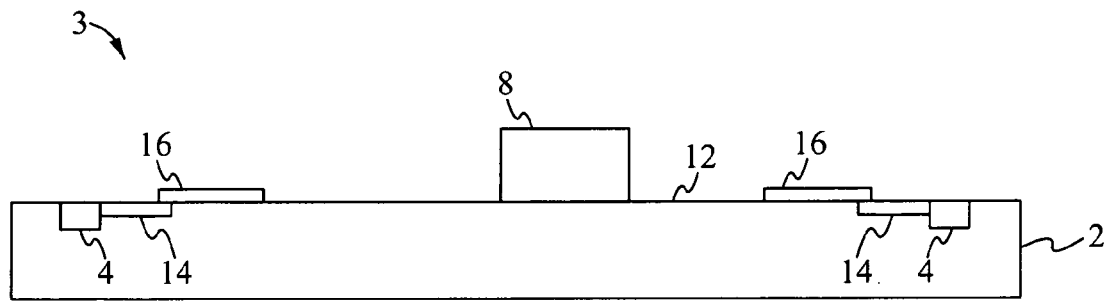
FIGS. 3-6 illustrate cut out side views of the shielding assembly during various steps of the manufacturing process.

FIGS. 3-6 illustrate cut out side views of the shielding assembly 3 during various steps of the manufacturing process. The electronic component 8 shown in FIGS. 3-6 represents the electronic component from the electronic device 1 (FIG. 1) with the greatest height relative to a top surface 12 of the substrate 2. In FIG. 3, one or more metallized contact bases 16 are added to the top surface 12 of the substrate 2. Each metallized contact base 16 forms a base portion of a corresponding metallized contact 6 (FIGS. 1 and 2). The metallized contact base 16 is a relatively thin conductive material, which is mechanically coupled to the substrate 2 using any conventional joining means and conductively coupled to the ground plane 4 using a conductive pathway 14, such as a trace, wire, or other conventional conducting means. Each of the conductive pathways 14 can be integrated within the substrate 2, as shown in FIGS. 3-6, or can be added to the top surface 12 of the substrate 2.

In some embodiments, the metallized contact bases 16 and conductive pathways 14 are added to the substrate 2 as a separate manufacturing step from building the substrate 2, such as when the substrate 2 is a printed circuit board. In other embodiments, the metallized contact bases 16 and the conductive pathways 14 are manufactured as part of the substrate manufacturing process, such as when the substrate 2 is an integrated circuit. In this case, the metallized contact bases and the conductive pathways can be made by depositing and etching appropriate conductive materials, as is well known in the art of printed circuit board manufacturing.

Figure 4:
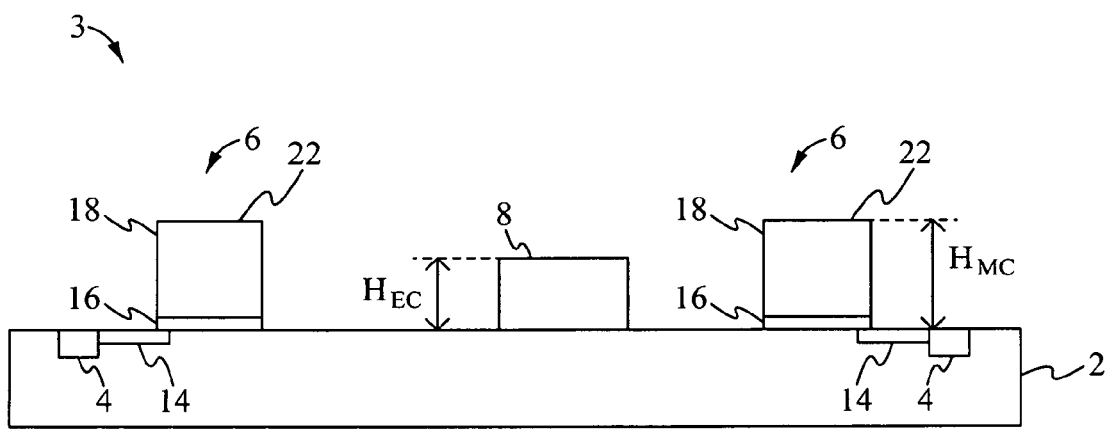

In FIG. 4, a metallized contact extension 18 is added to each metallized contact base 16. Each pair of metallized contact base 16 and metallized contact extension 18 form a metallized contact 6. The metallized contact extension 18 is coupled to the metallized contact base 16 using any convention joining means that enables a conductive pathway between the metallized contact extension 18 and the metallized contact base 16. In some embodiments, the metallized contact extension 18 is a solder ball, which is soldered to the metallized contact base 16 at their common interface. The height $H_{MC}$ of the metallized contact 6 is defined as the distance between the top surface 12 of the substrate 2 and a top surface 22 of the metallized contact 6. The height $H_{MC}$ of the metallized contact 6 is greater than a height $H_{EC}$ of the tallest electronic component 8 on the electronic device 1 (FIG. 1). Each of the metallized contacts 6 is substantially the same height. Alternatively, the height of the metallized contacts 6 are not all the same, as long as the height of each metallized contact 6 is greater than the height $H_{EC}$ of the tallest electronic component 8.

Figure 5:
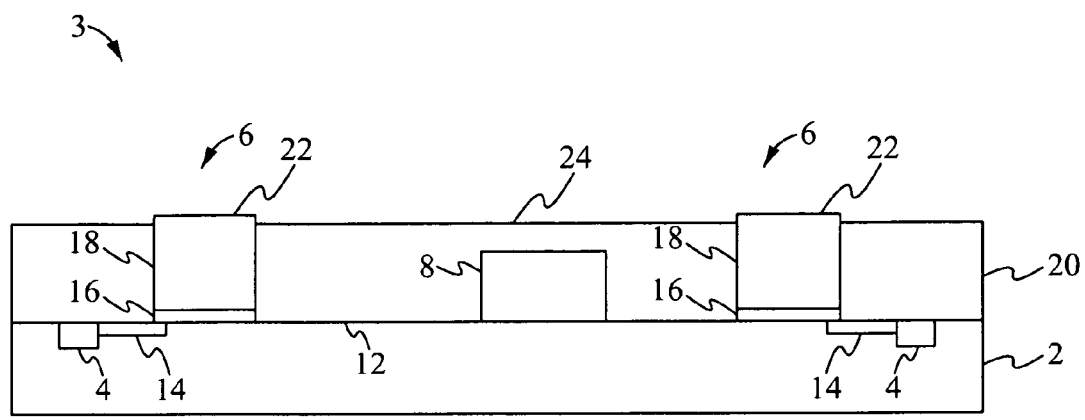

In FIG. 5, a mold compound layer 20 is applied to the top surface 12 of the substrate 2. The mold compound layer 20 is applied as a liquid so as to over-mold the electronic components 8 coupled to the substrate 2. In some embodiments, the mold compound layer 20 is applied using a transfer molding process. A thickness of the mold compound layer 20 is greater than the height $H_{EC}$ of the tallest electronic component 8, but less than the height $H_{MC}$ of the metallized contacts 6 such that a top surface 22 of the metallized contact extension 18 extends through a top surface 24 of the mold compound layer 20. A melting point of the mold compound material is less than a melting point of the metallized contact 6. When the mold compound layer 22 is applied to the substrate 2, the mold compound material conforms around metallized contact extensions 18. In this manner, all electronic components 8 coupled to the substrate 2 are covered with the mold compound material, but the top surface 22 of each metallized contact extension 18 is not covered by the mold compound material. The mold compound material provides environmental protection to the covered electronic components 8 to reduce, if not eliminate, many environmental conditions including, but not limited to, corrosion, humidity, and mechanical stress. The mold compound material is a non-conductive material, such as a dielectric epoxy.

Figure 6:
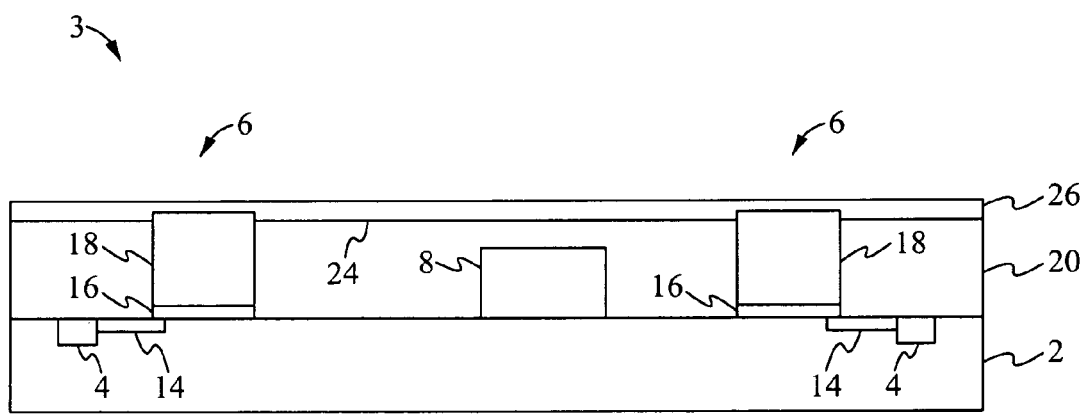

In FIG. 6, a conductive layer 26 is applied to the top surface 24 of the mold compound layer 20. The conductive layer 26 covers the mold compound layer 22 and the exposed top surfaces 22 of the metallized contact extensions 18. The conductive layer 26 is conductively coupled to the metallized contacts 6 via at least the contact between the conductive layer 22 and any exposed portion of the metallized contact extension 18, including the top surface 22. As the conductive layer 26 is conductively coupled to the metallized contact 6, the conductive layer 26 is also conductively coupled to the ground plane 4, thereby forming an electromagnetic shield over the electronic device 1 (FIG. 1) including the electronic components 8.

In some embodiments, the conductive layer 26 is a continuous solid layer over the mold compound layer 22 such that none of the mold compound layer 22 is exposed to the ambient. In some embodiments, the conductive layer 26 covers the top surfaces 22 of the metallized contact extensions 18, as shown in FIG. 6. Since the conductive layer 22 is applied to the entire top surface of the encapsulated electronic components 8, the electromagnetic shielding is form factor independent. In other embodiments, the conductive layer 26 does not cover the top surface 22 of the metallized contact extension 18. Instead, the top surface 22 extends above a top surface of the conductive layer 26, where the portion of the metallized contact extension 18 that extends from the mold compound layer 20, except for the top surface 22, is in contact with the conductive layer 26, thereby establishing a conductive connection between the conductive layer 22 and the metallized contact extension 18.

In other embodiments, the conductive layer 26 does not form a continuous layer, such as a mesh or perforated layer, where any openings in the conductive layer are smaller than the wavelengths of the electromagnetic signals to be shielded against.

In some embodiments, the conductive layer 22 is a conductive ink that is applied to the mold compound layer 22 using a screen printing or spray painting process. In other embodiments, the conductive layer 22 is sputtered or deposited onto the mold compound layer 22.

The shielding assembly can be applied to any conventional electronics device or module, such as a WiFi module or cellular telephone components, that require some degree of radiated electromagnetic shielding.

It is understood that the dimensions of the various layers and components shown in the Figures are not to scale, and are merely intended to indicate the relative positions and functions as described above. An overall height of the shielding assembly is application specific and depends on the height of the electronic components to be protected, since the mold compound layer and the conductive layer are form molded to these components.

The method of manufacturing an electromagnetic shield on the over-molded and encapsulated electronic components is accomplished without the use of a metal can shield. In using this process, the manufacturing advantages of over-molding in a panel form, which are common techniques of semiconductor assembly, can be leveraged to manufacture the shielding assembly in package modules including RF and/or other electromagnetic components. Using this type of panel processing, more than one shielding assembly, added to more than one electronic device, can be manufactured at the same and then cut apart.

The present invention has been described in terms of specific embodiments incorporating details to facilitate the understanding of the principles of construction and operation of the invention. The specific configurations shown and the methodologies described in relation to the various modules and the interconnections therebetween are for exemplary purposes only. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A method of providing electromagnetic shielding of one or more electronic devices, the method comprising:
    a. providing a substrate including a ground plane and one or more electronic devices coupled to a top surface of the substrate;
    b. adding one or more metallized contact base areas to the top surface of the substrate, wherein each of the metallized contact base areas is conductively coupled to the ground plane;
    c. adding a metallized contact extension to each metallized contact base area, thereby forming one or more metallized contacts;
    d. applying a liquified, non-conductive mold compound layer to the top surface of the substrate, the mold compound layer having a top surface, wherein the mold compound layer covers the one or more electronic devices and a top portion of each metallized contact extends from and above the top surface of the mold compound layer; and
    e. applying a conductive layer to the top surface of the mold compound layer, wherein the conductive layer is conductively coupled to the top portion of each metallized contact layer, thereby conductively coupling the conductive layer to the ground plane.

2. The method of claim 1 wherein each metallized contact has a height that is greater than a height of each of the one or more electronic devices coupled to the substrate.

3. The method of claim 2 wherein a thickness of the mold compound layer is less than the height of each of the one or more metallized contacts.

4. The method of claim 1 wherein adding the metallized contact base areas comprises depositing a conductive material layer on the top surface of the substrate and etching the conductive material layer.

5. The method of claim 1 wherein the metallized contact extension comprises a solder ball.

6. The method of claim 1 wherein applying the mold compound layer comprises using a transfer molding process.

7. The method of claim 1 wherein applying the conductive layer comprises using a screen printing process.

8. The method of claim 7 wherein the conductive layer comprises a conductive epoxy.

9. The method of claim 1 wherein applying the conductive layer comprises sputtering a conducive material onto the top surface of the mold compound layer.

10. The method of claim 1 wherein the conductive layer coupled to the ground plane shields the one or more electronic devices from electromagnetic interference.

11. The method of claim 1 wherein the conductive layer coupled to the ground plane provides radio frequency shielding of the one or more electronic devices.

12. The method of claim 1 wherein the mold compound layer protects the one or more electronic devices from environmental conditions including corrosion, humidity, and mechanical stress.

13. The method of claim 1 wherein the mold compound layer comprises a dielectric epoxy.

14. The method of claim 1 wherein the mold compound layer conforms around the metallized contacts when applied to the top surface of the substrate.

15. The method of claim 1 wherein the mold compound layer forms an over-molded package over the one or more electronic devices.

16. A method of providing electromagnetic shielding of one or more electronic devices, the method comprising:
   a. providing a substrate including a ground plane and one or more electronic devices coupled to a top surface of the substrate;
   b. adding one or more metallized contact base areas to the top surface of the substrate, wherein each of the metallized contact base areas is conductively coupled to the ground plane;
   c. adding a metallized contact extension to each metallized contact base area, thereby forming one or more metallized contacts, wherein each metallized contact has a height that is greater than a height of each of the one or more electronic devices coupled to the substrate;
   d. applying a liquified, non-conductive mold compound layer to the top surface of the substrate, the mold compound layer having a top surface, wherein the mold compound layer covers the one or more electronic devices, further wherein a thickness of the mold compound layer is less than the height of each of the one or more metallized contacts such that a top portion of each metallized contact extends from and above the top surface of the mold compound layer; and
   e. applying a conductive layer to the top surface of the mold compound layer, wherein the conductive layer is conductively coupled to the top portion of each metallized contact layer, thereby conductively coupling the conductive layer to the ground plane.

17. The method of claim 16 wherein adding the metallized contact base areas comprises depositing a conductive material layer on the top surface of the substrate and etching the conductive material layer.

18. The method of claim 16 wherein the metallized contact extension comprises a solder ball.

19. The method of claim 16 wherein applying the mold compound layer comprises using a transfer molding process.

20. The method of claim 16 wherein applying the conductive layer comprises using a screen printing process.

21. The method of claim 20 wherein the conductive layer comprises a conductive epoxy.

22. The method of claim 16 wherein applying the conductive layer comprises sputtering a conducive material onto the top surface of the mold compound layer.

23. The method of claim 16 wherein the conductive layer coupled to the ground plane shields the one or more electronic devices from electromagnetic interference.

24. The method of claim 16 wherein the conductive layer coupled to the ground plane provides radio frequency shielding of the one or more electronic devices.

25. The method of claim 16 wherein a difference between the thickness of the mold compound layer and the height of each electronic device is equal to or greater than a predetermined minimum value.

26. The method of claim 16 wherein the mold compound layer protects the one or more electronic devices from environmental conditions including corrosion, humidity, and mechanical stress.

27. The method of claim 16 wherein the mold compound layer comprises a dielectric epoxy.

28. The method of claim 16 wherein the mold compound layer conforms around the metallized contacts when applied to the top surface of the substrate.

29. The method of claim 16 wherein the mold compound layer forms an over-molded package over the one or more electronic devices.

* * * * *